United States Patent [19]

Young et al.

[11] Patent Number: 5,066,995
[45] Date of Patent: Nov. 19, 1991

[54] DOUBLE LEVEL CONDUCTOR STRUCTURE

[75] Inventors: William R. Young; Anthony L. Rivoli, both of Palm Bay, Fla.

[73] Assignee: Harris Corporation, Melbourne, Fla.

[21] Appl. No.: 25,435

[22] Filed: Mar. 13, 1987

[51] Int. Cl.[5] .................... H01L 27/02; H01L 29/04; H01L 29/06

[52] U.S. Cl. ........................................ 357/42; 357/59; 357/91; 357/23.9

[58] Field of Search ...................... 357/23.11, 86, 675, 357/59 I, 59 R, 59 G, 59 J, 71, 71 S, 42, 50, 23.9, 91, 59 K; 437/40, 41

[56] References Cited

U.S. PATENT DOCUMENTS

| | | | |
|---|---|---|---|
| 3,967,981 | 7/1976 | Yamazaki | 357/59 G |
| 4,041,518 | 8/1977 | Shimizu et al. | 357/99 |
| 4,224,733 | 9/1980 | Spadea | 357/59 |
| 4,412,311 | 10/1983 | Miccoli et al. | 357/23.11 |
| 4,417,385 | 11/1983 | Temple | 357/59 G |
| 4,476,482 | 10/1984 | Scott et al. | 357/42 |
| 4,519,126 | 5/1985 | Hsu | 357/42 |
| 4,616,401 | 10/1986 | Takeuchi | 357/23.9 |
| 4,660,062 | 4/1987 | Nishizawa et al. | 357/42 |
| 4,700,215 | 10/1987 | McPherson | 357/59 |
| 4,703,552 | 11/1987 | Baldi et al. | 357/42 |
| 4,821,085 | 4/1989 | Haken et al. | 357/23.9 |
| 4,873,204 | 10/1989 | Wong et al. | 357/42 |

FOREIGN PATENT DOCUMENTS 55-43885  3/1980  Japan .................. 357/23.11

OTHER PUBLICATIONS

IEDM Technical Digest, 1984, #5.3, pp. 118–120, by Chen et al.

Primary Examiner—Mark Prenty
Attorney, Agent, or Firm—Evenson, Wands, Edwards, Lenahan & McKeown

[57] ABSTRACT

A double level conductive structure is provided wherein one conductor layer permits impurities to pass therethrough in a given impurity introduction steph while double conductor level portion substantially prevents such impurities from passing therethrough due to a greater combined resistance to impurity penetration.

5 Claims, 5 Drawing Sheets

DOUBLE LEVEL CONDUCTOR STRUCTURE

FIELD OF THE INVENTION

The present invention relates generally to an improved process for forming integrated circuits and the resulting semiconductor products. More specifically, the present invention relates to extremely fine geometry devices in a highly integrated CMOS circuit and to a process for forming such devices.

BACKGROUND AND SUMMARY OF THE INVENTION

A double level conductive structure is provided wherein one conductor layer permits impurities to pass therethrough in a given impurity introduction step while double conductor level portion substantially prevents such impurities from passing therethrough due to a greater combined resistance to impurity penetration.

Several problems persist in the semiconductor industry and more Particularly in CMOS products and their manufacture. Common to existing CMOS processes are the need for a reduction in the NMOS to PMOS spacing and the need to reduce body overlap of the MOS source/drain. It is additionally necessary to find methods of reducing the source and drain capacitance and resistance in CMOS devices. Furthermore, it is necessary to reduce the threat of contact punch through of the source and drain regions.

Typical approaches to solving these problems have included the provision of guard rings between the source and drain regions of adjacent devices, the use of self-aligned gate processes, the careful tailoring of source and drain doping levels and the provision of thin (or not so thin) gate oxides. Notwithstanding these approaches it is a continuing objective in the semiconductor processing field to obtain further improvements in each of the above-identified areas.

It has been discovered that by providing a buried dielectric beneath the sources and/or the drains of adjacent CMOS devices which are abutted for instance drain to drain, it is possible to provide a conductive layer providing an ohmic contact to each of the adjacent regions thereby allowing zero spacing between adjacent NMOS and PMOS devices. This approach is described in greater detail in the co-pending, and commonly owned application of Kenneth K. O., Lawrence G. Pearce and Dyer A. Matlock entitled "CMOS Device Having Reduced Spacing Between N and P Channel Transistor Pair", filed May 29, 1987, U.S. Ser. No. 055,558 now U.S. Pat. No. 4,829,359. A feature of this approach is the utilization of a powerful ion implanter capable of forming a buried dielectric region. The problems of reduced NMOS to PMOS spacing are solved with this approach since the NMOS and PMOS drains are shorted by the conductor thus allowing them to abut without breakdown problems. In ordinary CMOS circuits the drain must be contained within the body in order to prevent breakdown or MOS action between the drain of one type device to the body of the adjacent device of the opposite type. The use of the buried dielectric solves this problem.

An alternative process has been discovered and is described herein which creates a buried oxide region. One manner of implementing this process permits formation of the buried oxide without the use of ion implantation to directly form this buried oxide region. Thus, the powerful ion implanter of the above-mentioned process is not needed in the present approach.

As used herein, the term sidewall isolated refers to any semiconductor region laterally bounded by a dielectric material. As shown in a preferred embodiment of FIG. 4a, a single crystalline substrate 400 is provided with a pattern of dielectric sidewall isolating regions 420. These regions may be formed by, for instance, local oxidation of the substrate or high energy implantation of impurities or by etching the silicon in the isolation regions, forming a dielectric and planarizing the surface, it being significant that the sidewall isolated structure formed in the substrate extend from the substrate surface 401 substantially into the substrate and it being preferred that the top surface 421 of the dielectric regions 420 be substantially planar with the top surface 401 of the substrate. In a silicon substrate 400, an oxide region 420 may be formed by a local oxidation process. The local oxidation process uses a thin oxide region to protect the silicon surface, silicon nitride is deposited and patterned to remove nitride from areas which are to be oxidized, silicon will only be oxidized in the exposed areas, the silicon nitride protected areas will not oxidize; the wafers are oxidized to the desired depth and the nitride is removed. The surface may then be planarized either by removal of that portion of oxide which is above the surface 401 of the silicon substrate or by building up the single crystalline silicon to a new level 401 which above the original substrate surface such that the silicon and oxide have a planar top surface 401. The planar surface facilitates subsequent processing.

Another method of forming the sidewall isolating regions may be by implanting oxygen to the proper depth, then raising the temperature to convert the implanted oxygen to silicon dioxide. This process minimizes the temperature time product required to form the isolation region and also minimize the lateral encroachment into the single crystal region by the isolation region. In a local oxidation process as oxygen is diffusing downward some is also diffusing laterally causing encroachment into the single crystal region.

A planarized trench oxide isolation is performed by etching the silicon in the trench isolation regions to the desired width and depth, depositing the insulating oxide sufficient to completely fill the trench isolation region and also cover the surface of the wafer, a planarization process such as described in U.S. Pat. No. 4,515,652 is used to remove the oxide from the surface of the wafer and leave the oxide in the trench approximately at the same level as the surface of the wafer.

The process of the present invention commences with the formation of a sidewall isolated wafer consisting of an N+ substrate having an N-single crystalline layer thereover and having oxide isolating tracks in the surface of the wafer to define isolated regions within the wafer. An epitaxial process is used to form a single crystal layer over the single crystalline regions of the wafer and to form polycrystalline silicon over the oxide regions of the wafer. This wafer is then used in a sidewall isolated CMOS process. The device is aligned to the single crystal regions such that the gate regions are over single crystal regions and NMOS and PMOS drain extensions are built over the original buried oxide regions. The NMOS and PMOS drains may abut the buried oxide regions.

A second manner of implementing the process involves providing a side wall isolated wafer, implanting bodies, growing a gate oxide and forming a gate polycrystalline silicon which is oversized, then removing the exposed gate oxide, depositing a second polycrystalline silicon layer and patterning, using a photoresist process, to provide openings for implanting source and drain regions. The source and drain regions are then implanted.

A third alternative process involves providing a sidewall isolated wafer, implanting bodies and growing a gate oxide, patterning the gate oxide followed by depositing a polycrystalline silicon layer and patterning the polycrystalline silicon layer over the gate oxide. The process is then concluded as described with respect to the second process alternative described above.

The fourth alternative implementation of the process of the invention involves commencing with a sidewall isolated wafer, implanting device bodies, growing a gate oxide and depositing a polycrystalline silicon layer over the oxide and defining the polycrystalline silicon layer. Next are implants of N and P LDD (lightly doped drain) regions followed by the formation of gate sidewall spacers. A mask layer protecting the gate and gate spacers is provided and the spacer on the polycrystalline silicon region which will become an extension of the source/drain region is removed. The photoresist is stripped and the exposed gate oxide is then removed. The N+ regions are protected with photoresist and a P+ implant is provided on the P type regions. The P type regions are then protected and the N+ implants are provided to form the sources and drains. The gate polycrystalline silicon is doped by the source/drain implants. A silicide is then formed on all exposed single crystal and polycrystalline silicon regions. It is noted, however, that the silicide metal will bridge the gate oxide (approximately 250 angstroms) but will not bridge the gate spacer oxide (approximately 5000 angstroms). Next an oxide is deposited, the contacts are cut, metal is deposited and patterned, additional oxide is added, vias are formed and final metal is applied. A passivation layer is then applied and bond pads are opened for final bonding. It is noted that all contacts in this arrangement are to the polycrystalline silicon regions as opposed to any single crystal regions thus permitting all contacts to be made at the same level. It is further noted that this arrangement could be modified such that some contacts are made to the underlying single crystal regions in order to reduce source/drain area required.

It is noted that several variations of each of the above process approaches are possible. Such as, formation of the sidewall isolated wafer by either a local oxidation or a planarized oxide process; formation of transistors employing a lightly doped drain if a minimization of hot electron effects is desired., transistors can be formed without lightly doped drains; the gate can be doped when the source and drains are doped or by a separate polycrystalline silicon doping operation; starting wafers can be of either N or P doped silicon or of epitaxially grown silicon on either N+ or P+ substrates or silicon on insulator substrates or dielectrically isolated substrates; the bodies can be either single well or twin well; the sequence for implanting or diffusing N and P type impurities can be reversed; one or more levels of metal can be employed on either a planar or nonplanar oxide; alternative dielectrics can be used including oxide, nitride or oxynitride; either a photoresist or metal could be used to block implants; the use of polycrystalline silicon to form the source and drain regions could be applicable to NMOS and PMOS processes as well as to CMOS processes; prior to depositing the metal which will be converted to a silicide a portion of the exposed gate oxide over source/drain regions could be masked to allow only the unmasked portions of the source/drain regions to be silicided; the silicide could be formed prior to the doping of the source and drain regions; and any number of different materials could be used to form the silicide including Ti, W, Cr, Mo, Ta, Pt, Pd, Co or other silicide forming metal. Another alternative is the use of a selective deposition of a low resistivity material such as Ti, W, Cr, Mo, Ta, Pt, Pd, Co or other metals without converting these materials to a silicide.

It is additionally noted that a selective epitaxial growth prior to the silicide formation in the fourth implementation of the process described above would provide the necessary silicon for the silicide without requiring consumption of any of the existing silicon which might otherwise cause a shorting of the source/drain region to the body by the silicide. The selective epitaxial growth could be designed so as not to deposit on the oxide, especially the gate spacer oxide.

BRIEF DESCRIPTIONS OF THE DRAWINGS

DETAILED DESCRIPTION OF THE INVENTION

Figure 1A:
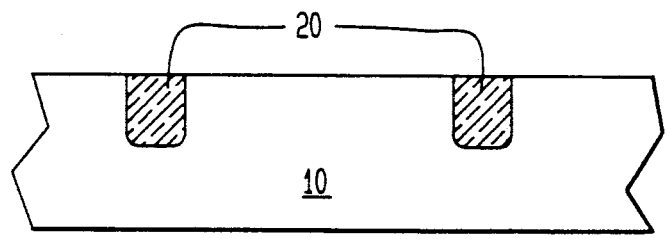
FIGS. 1a through 1f illustrate the process of forming a polycrystalline silicon source and drain CMOS device utilizing a side wall isolated wafer.

FIG. 1a is a cutaway of a sidewall isolated wafer showing the presence of the substrate 10 which may be of single crystalline material and the dielectric isolating material 20. In the preferred practice of the invention, the substrate 10 is of silicon and the dielectric 20 is silicon dioxide. Thus, although this invention could be used to advantage with gallium arsenide substrates as well, the following description is provided with respect to silicon. The formation of dielectric regions 20 may be for instance by implantation of oxygen and activation of the oxygen to form silicon dioxide; by local oxidation of silicon or by etching the silicon followed by an oxide deposition or growth then a planarization step, which is referred to as planarized trench isolation.

Figure 1B:
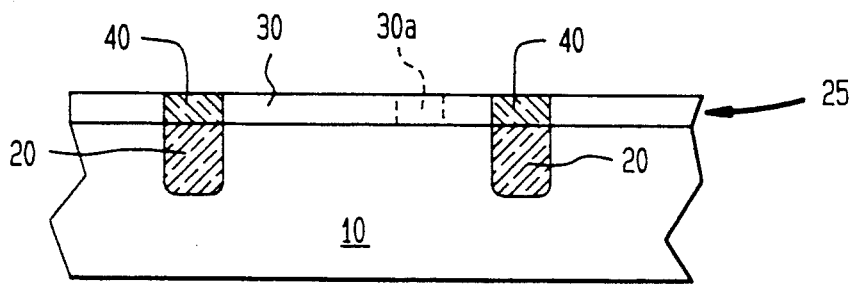

FIG. 1b shows a grown layer 25 including an epitaxial semiconductor layer 30 of silicon which grows over the single crystal portion of the surface of the substrate shown in FIG. 1a. However, in the regions 40 over the dielectric, polycrystalline silicon is formed since an epitaxial layer does not form over the oxide in the typical epitaxial growth process. It is possible to cause the single crystal silicon to form over a very narrow buried dielectric so long as the width of the dielectric is less than about 2,000 angstroms. The polycrystalline silicon formed in a typical epitaxial process can be converted to single crystal silicon by recrystallization using the adjacent single crystal region as a seed. For gallium arsenide as a semiconductor layer 30, either epitaxial growth or liquid phase expitaxial growth could be used.

Figure 1C:
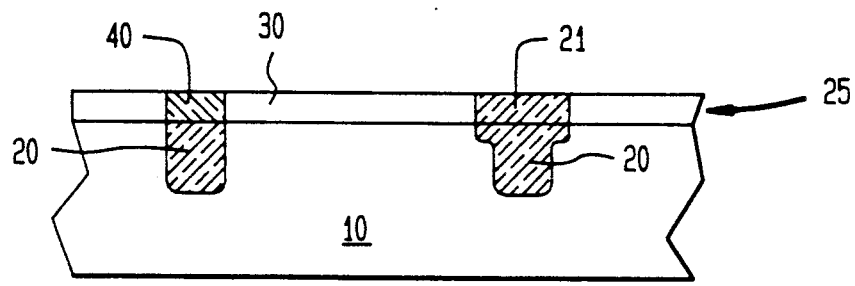

FIG. 1c shows the formation of sidewall isolating regions 21 by oxidation of selected polycrystalline silicon regions 40 to form a sidewall isolated substrate. This step may be performed by a local oxidation process; implantation of oxygen; or by etching the silicon, depositing an oxide then performing a planarization step. Thus, selected portions of the polycrystalline silicon regions 40 or silicon regions 30 are converted to oxide regions 21 thus bringing selected sidewall isolating regions to the surface of the structure. This results in a substrate structure having a substantially planar top surface. This top surface is formed by the top surfaces of three region types, the single crystalline islands (defined by the silicon dioxide) the silicon dioxide regions and the polycrystalline silicon regions which were not converted to silicon dioxide. Region 21 can be made slightly wider than the underlying oxide region 20 and slightly deeper than grown layer 25 to insure that a good single crystal region exists at its edge. By insuring that region 21 extends beyond the edge of region 20, it is also insured that the polycrystalline silicon region is fully converted to oxide. It should be appreciated that the significance of providing the oversized oxide is that this insures that all of the poly is converted to oxide. Thus, even if the poly does not laterally extend to the edge of the underlying oxide region, it will be sufficient if this narrower poly region is entirely converted to oxide.

Figure 1D:
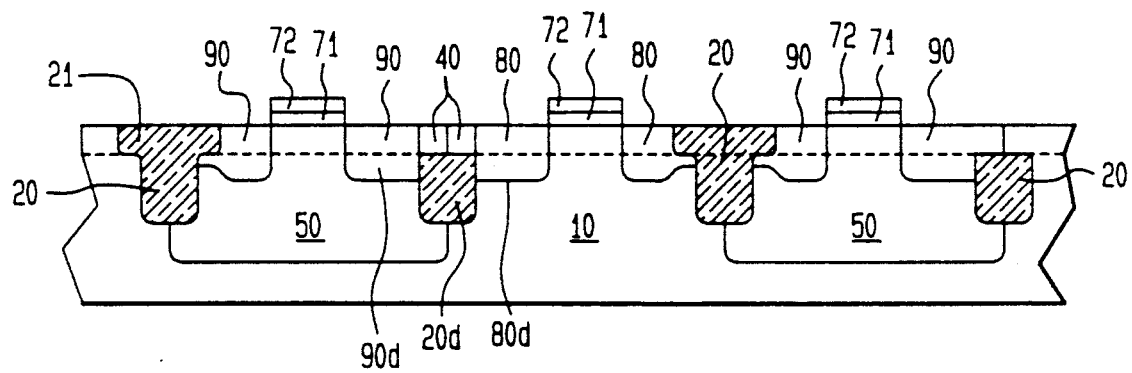

FIG. 1d illustrates a larger portion of the sidewall isolated wafer. A body implant is provided for first device types in selected regions 50 between portions of polycrystalline silicon region 40 and portions of oxide region 21. Then, gate oxide 71 is formed and a gate 72 is formed thereover in each device area between the oxide regions 20. Device forming dopants are introduced for the respective device types, preferably by implantation, to form source and drain regions 80 of a first conductivity type and source and drain regions 90 of a second conductivity type. Regions 80 and 90 consist of both the polycrystalline silicon and single crystal silicon portions of the source and drain regions. In an approach optimized for space reduction, region 80d is abutting the sidewall of oxide region 20d while region 90d abuts the opposite sidewall of oxide region 20d. It is noted that regions 80 and 90 are abutting over oxide region 20d.

Figure 1E:
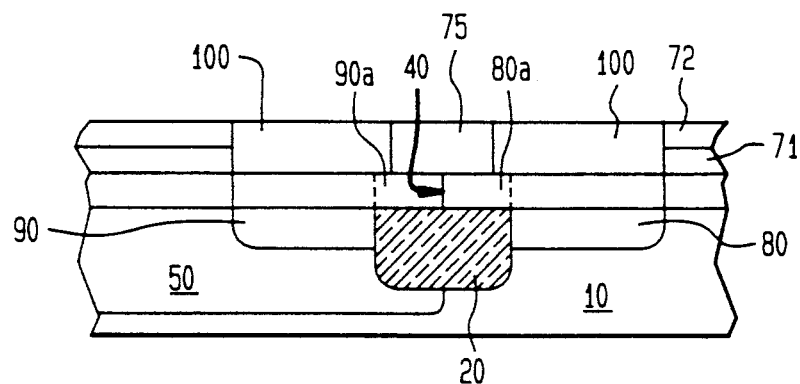

FIG. 1e shows an expanded version of the structure resulting at each of the polycrystalline silicon regions 40 which has not been converted into an oxide region 21. The device region 90 is formed such that approximately half of the polycrystalline silicon region 40 is converted to the conductivity type of device region 90. Likewise, device region 80 is formed such that some portion, preferably the remainder of polycrystalline silicon region 40 is converted to the conductivity type of device region 80. Thus, a junction is formed between the device region extension 90a and the device region extension 80a. As may be appreciated, this is equivalent to abutting the device regions 90 and 80. Next, in order to eliminate the operation of the device formed by the 50 to 90 to 80 to 10 layer structure, a conducting member 75 is ohmically connected to both of regions 90a and 80a to thereby short the junction. This conducting member may act as the drain contact for both of drain regions 90 and 80 in a CMOS application. The conducting member 75 may be formed of a silicide created by providing a properly defined polycrystalline layer portion and converting such portion to a silicide. In a particularly compact arrangement the device region extensions themselves may be converted in whole or in part to a silicide to provide the desired conducting member. In this arrangement the lateral expanse of the polycrystalline layer portion is contained within the combined lateral expanse of the drains 80, 90 and the portion of the sidewall isolating region there between. It may be desirable to convert the entire thickness of the silicon layer 25 to a silicide although such may not be necessary. As may be appreciated, it is possible to provide the silicon layer and convert it to a silicide prior to forming the doped regions to which the contact is desired. In this instance, impurities are passed through the silicide by implantation or diffusion.

Figure 1F:
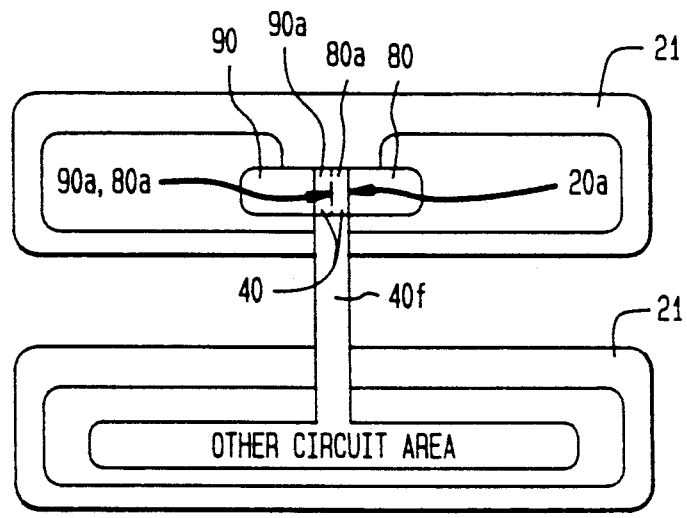

FIG. 1f is a top view showing the device region extensions 80a and 90a forming a PN junction 90a80a over oxide region 20a. It is noted that while region 20a is located generally between the regions 90 and 80, it is possible to form the polycrystalline silicon region 40 into a conductor for connection to devices in another circuit area which may even be in a separate isolated region. This conductor is illustrated as region 40f.

The structure formed according to this manner of practicing the invention allows for the abutting of adjacent drain regions at or near the substrate surface while providing a buried dielectric beneath this junction for the purpose of avoiding unwanted shorting from the body of one device to the drain of the adjacent device. It is noted that the introduction of impurities may be masked in such a manner as to avoid the formation of a junction of the device region extensions. In this case, there may remain an undoped polycrystalline silicon region over the dielectric. Also, the drain regions, for instance, may be somewhat laterally spaced from the sidewall isolation region. For optimum spacing efficiency, it may be beneficial to keep this spacing smaller than the lateral thickness of the sidewall isolating region. Nonetheless, it is still possible to provide a drain-to-drain short by converting the polycrystalline silicon region to a conductor or providing a conductor thereover. A practical way of rendering the polycrystalline silicon region conductive involves the conversion of at least a part of the thickness of the silicon layer to a silicide.

It will be appreciated that the depth to which drains 80 and 90 are formed should be greater than the depth of the epitaxial silicon layer 30 and polycrystalline silicon layer 40 in order to provide maximum protection against shorting to the body region of the adjacent device. It is also preferred to form the drains such that they do not extend below the dielectric regions 20.

While the foregoing describes a practical implementation of the invention in a silicon substrate, it may sometimes be desirable to utilize a variation of the process flow just described. For instance in FIG. 1b, the semiconductor layer 30 may be of gallium arsenide instead of silicon in which case, portions of GaAs could be removed at regions 40 to expose the dielectric or, portions 30a of the GaAs could be removed to expose the silicon substrate for silicon processing. This will facilitate hybrid silicon/GaAs product fabrication.

Figure 2A:
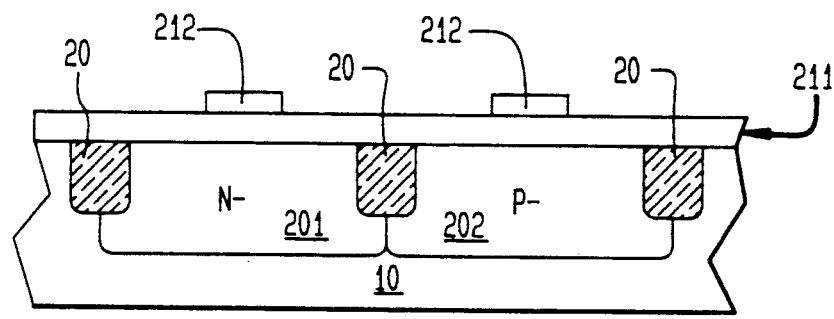
FIGS. 2a through 2c illustrate another manner of implementing the polycrystalline silicon source and drain CMOS process of the invention.
Figure 2B:
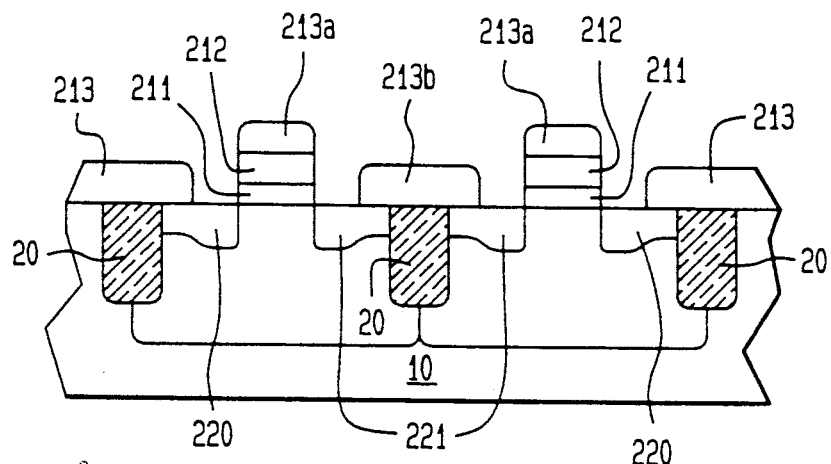
Figure 2C:
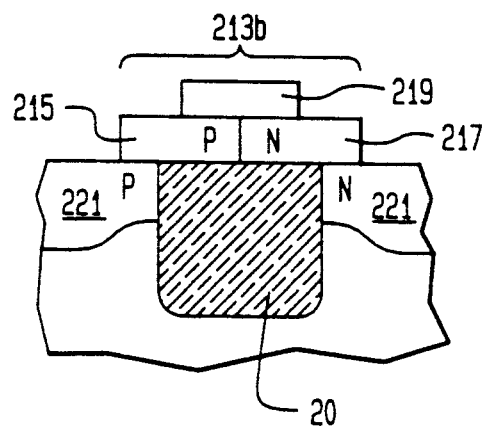

Returning to silicon, the following alternative could be adopted. A sidewall isolated wafer is formed and body regions are formed, preferably implanted, as shown in FIG. 2a where an uniformly doped silicon wafer 10 has N- body region 201 and p- body region 202 formed between adjacent sidewall isolation dielectric regions 20. Next, a gate dielectric 211 such as an oxide or oxynitride, is formed directly on the surface of the substrate and a conductive or semiconductive layer which may be of gate metal or polycrystalline silicon is provided thereon and patterned to provide oversized gate regions 212. For this example, a polycrystalline silicon gate will be described. Next, the polycrystalline silicon regions 212 are utilized as masks and the exposed portion of the gate dielectric 211 is removed. A second conductive or semiconductive layer 213 is then applied directly on the surface of the substrate, the exposed gate dielectric regions and the regions 212. This layer may also be of any good conducting or semiconducting material (such as a refractory or other metal) and for purposes of this example are described as polycrystalline silicon. As shown in FIG. 2b, the combined polycrystalline silicon layer 212 and 213 is patterned to provide the final gate length and gate thickness of 212 and 213a and to provide a thinner polycrystalline region 213b which overlays isolating dielectric region 20 and contacts the drain regions 221. The region under the combined thickness of 212 and 213a is masked by these layers while the region under 213b will become doped. This masking provided by the combined thickness 212 and 213a will substantially inhibit dopants from reaching the underlying substrate. In some cases, no dopants will reach the substrate under the combined layer 212, 213a. The oversize gate provides sufficient size to allow the final gate size to be defined such that the gate length is only a function of the patterning and the gate thickness is a uniform layer 212 covered by a uniform layer 213. Sources 220 and drains 221 are implanted such that the drains 221 are proximate the respective sides of the isolation dielectric 20. In the drawing, drains 221 abut the dielectric 20 and also are formed in the polycrystalline region 213b where a junction is formed between common drains of complementary MOS devices. This is accomplished by providing an implant of first conductivity type device regions utilizing a mask over those areas where the second conductivity type devices are to be formed and then removing the first mask and masking the areas where the first conductivity type regions were formed as the second conductivity type device regions are implanted. In this sequence, impurities are introduced into the polycrystalline silicon regions associated with the respective devices. In a balanced approach, about half the lateral expanse of said polycrystalline silicon region is caused to be of said first conductivity type and the remainder is of said second conductivity type. In a second approach, the entire surface is implanted with said first conductivity type impurities and then about half of the lateral expanse is counterdoped. The depth of the drain implants must be deeper than the thickness of 213b but less than the thickness of the combined polycrystalline layer 213a and 212 plus the gate oxide 211. The more significant concern is that the impurity introduction in this step does not result in doping of the channel but does dope the portions of region 212 below region 213a if required for the purpose of establishing the work function of the layer. The doped polycrystalline silicon region 213b is an extension of the drains and is thus referred to as a device region extension or drain extension. FIG. 2c shows the polycrystalline silicon region 213b where portion 215 is the device region extension of the P type drain and portion 217 is the drain extension of the N type drain. The junction formed between drain extensions 215 and 217 may then be shorted, for instance, by providing a metal contact 219 overlapping both drain extensions 215 and 217. Alternatively, a silicide forming metal may be reacted with the silicon drain extensions to form a silicide short. So long as at least a portion of the thickness of the drain extensions is converted to a silicide the desired short will be provided. This arrangement allows minimum drain to drain spacing of the NMOS and PMOS devices in the CMOS process. In a modified version of the above process, it is possible to provide the first layer of polycrystalline adjacent the substrate (or the substrate and thin dielectric) and then provide the second polycrystalline silicon layer over the first at selected portions. In this instance, impurity introduction through the first polycrystalline silicon layer will be permitted while impurity introduction will be masked by the combined thickness of the first and second polysilicon layers at those locations where the second polycrystalline silicon layer is provided over the first layer.

An example of an impurity introduction step which will be masked by the combined thickness of the two levels of polycrystalline silicon but which will penetrate a single level of polysilicon is a typical source/drain implant. To block this typical implant, a 4,500 Angstrom layer (or total thickness) of polycrystalline silicon will be sufficient. To permit this implant to penetrate the polycrystalline silicon, a layer of less than 2,000 Angstroms is satisfactory. This assumes that implant energies of about 100KEV for Boron, 150KEV for Arsenic and 120KEV for Phosphorus are employed. In the event that the impurity introduction is to be through a silicide, the layer thickness would be reduced by about 25%–40%. For other materials such as conductive metals, the relative thicknesses of the layers may be easily determined.

Figure 3:
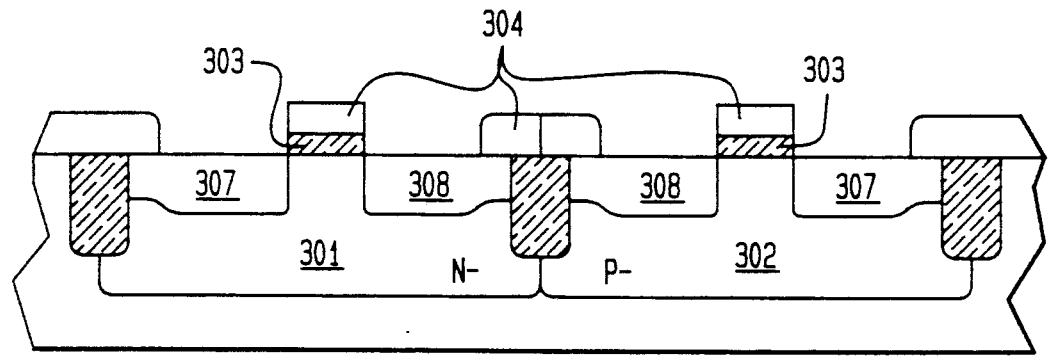
FIG. 3 illustrates another alternative implementation of the polycrystalline silicon source and drain CMOS process of the invention.

A variation of the above described process may be preferred in some instances, such as if a relatively thick gate oxide is to be formed. Commencing with a sidewall isolated wafer as previously described, N- and P- bodies 301, 302 are formed and a gate oxide 303 is formed and patterned. Then, a polycrystalline silicon layer 304 is formed and patterned to form the structure illustrated in FIG. 3. Device regions 307, 308 are formed as described with respect to FIGS. 2b and 2c and the same beneficial abutting of the CMOS drains 308 in the polycrystalline 304 is obtained. The remaining process steps similar to those described with respect to FIGS. 2a–2c are then followed to complete the IC manufacture. It is noted that while this process sequence is less complex than that described with respect to FIGS. 2a–2c, this process may be subject to the need to remove a photoresist from the oxide prior to the deposition of the polycrystalline silicon layer. In thin oxide processes it is not easy, after photoresist removal, to remove contamination by a deglaze step since this will etch the thin oxide. However, in a process which omits this photoresist, such as where a directed ion beam or a laser enhanced etch is utilized, this process variation may be adopted.

In the manufacture of very high density, large scale integrated circuits it may be preferred to utilize the following variation of the invention, particularly if there are to be a plurality of metallization layers in the final structure. This variation of the process provides a substantially planar final surface which is particularly desirable in multi-level metal processes.

Figure 4A:
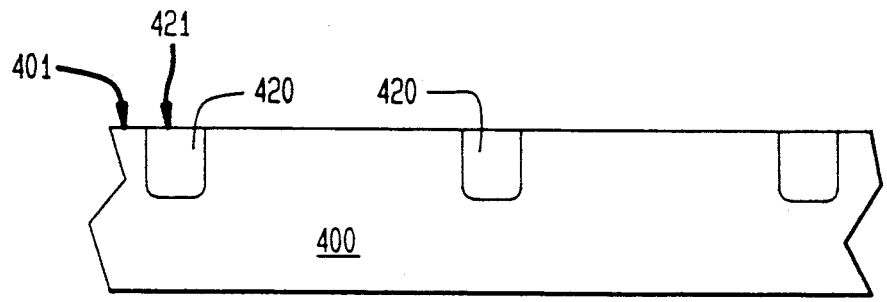
FIGS. 4a through 4d illustrate another manner of implementing the process of the present invention.

As shown in FIG. 4a, a single crystalline substrate 400 is provided with a pattern of dielectric sidewall isolating regions 420. These regions may be formed by, for instance, local oxidation of the substrate or high energy implantation of impurities or by etching the silicon in the isolation regions, forming a dielectric and planarizing the surface, it being significant that the sidewall isolated structure formed in the substrate extend from the substrate surface 401 substantially into the substrate and it being preferred that the top surface 421 of the dielectric regions 420 be substantially planar with the top surface 401 of the substrate. In a silicon substrate 400, an oxide region 420 may be formed by a local oxidation process. The local oxidation process uses a thin oxide region to protect the silicon surface, silicon nitride is deposited and patterned to remove nitride from areas which are to be oxidized, silicon will only be oxidized in the exposed areas, the silicon nitride protected areas will not oxidize; the wafers are oxidized to the desired depth and the nitride is removed. The surface may then be planarized either by removal of that portion of oxide which is above the surface 401 of the silicon substrate or by building up the single crystalline silicon to a new level 401 which above the original substrate surface such that the silicon and oxide have a planar top surface 401. The planar surface facilitates subsequent processing.

Another method of forming the sidewall isolating regions may be by implanting oxygen to the proper depth, then raising the temperature to convert the implanted oxygen to silicon dioxide. This process minimizes the temperature time product required to form the isolation region and also minimize the lateral encroachment into the single crystal region by the isolation region. In a local oxidation process as oxygen is diffusing downward some is also diffusing laterally causing encroachment into the single crystal region.

A planarized trench oxide isolation is performed by etching the silicon in the trench isolation regions to the desired width and depth, depositing the insulating oxide sufficient to completely fill the trench isolation region and also cover the surface of the wafer, a planarization process such as described in U.S. Pat. No. 4,515,652 is used to remove the oxide from the surface of the wafer and leave the oxide in the trench approximately at the same level as the surface of the wafer.

Figure 4B:
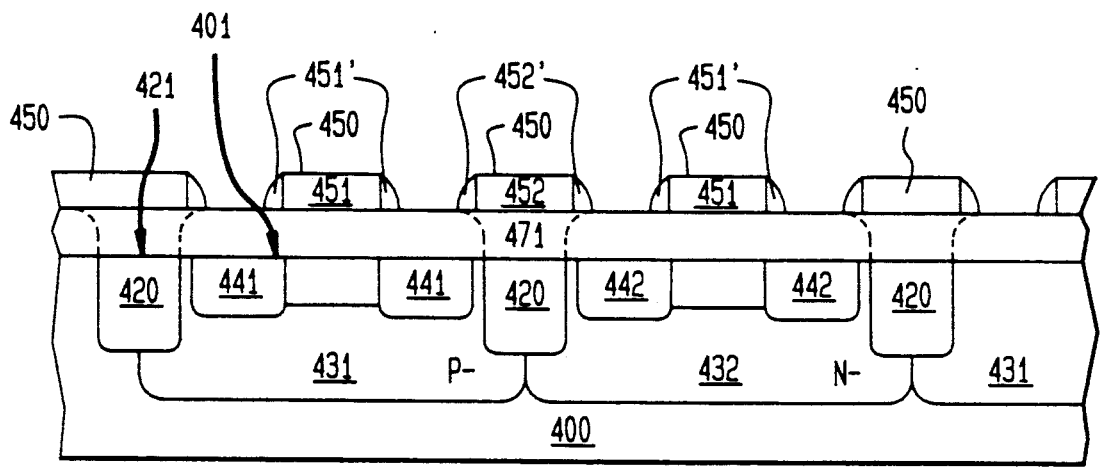
Figure 4C:
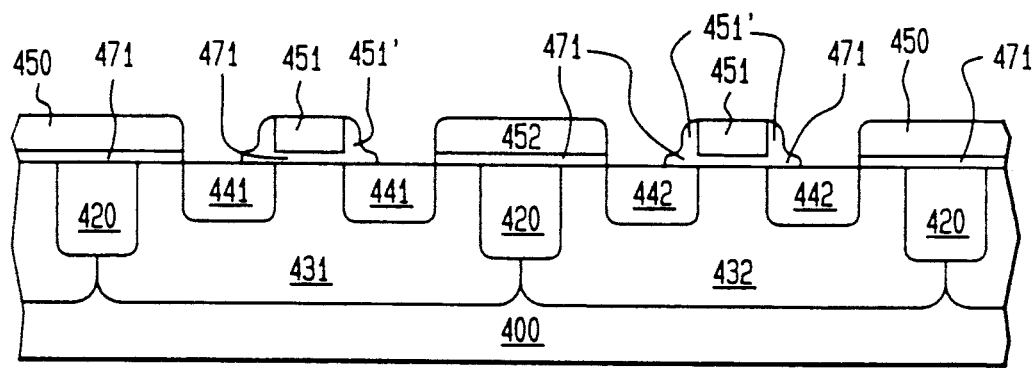
Figure 4D:
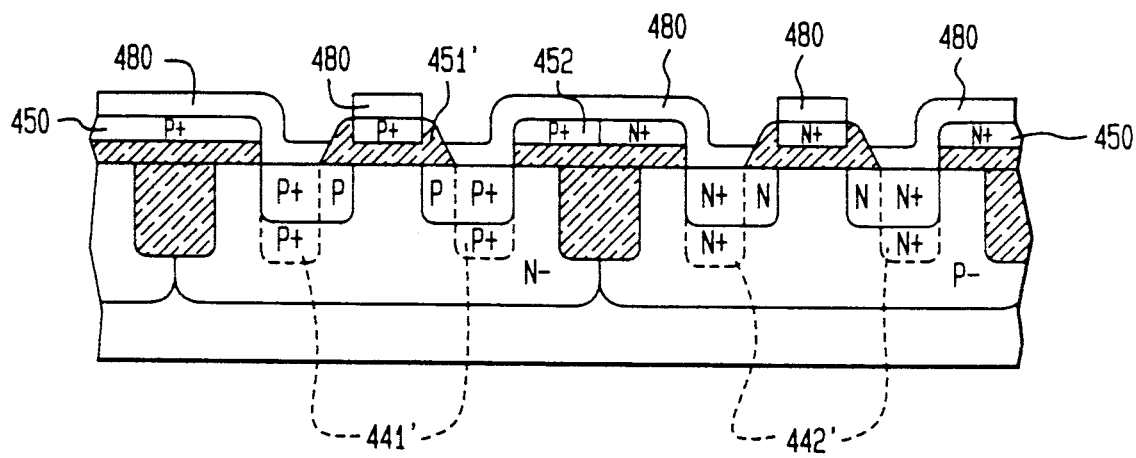
Figure 5:
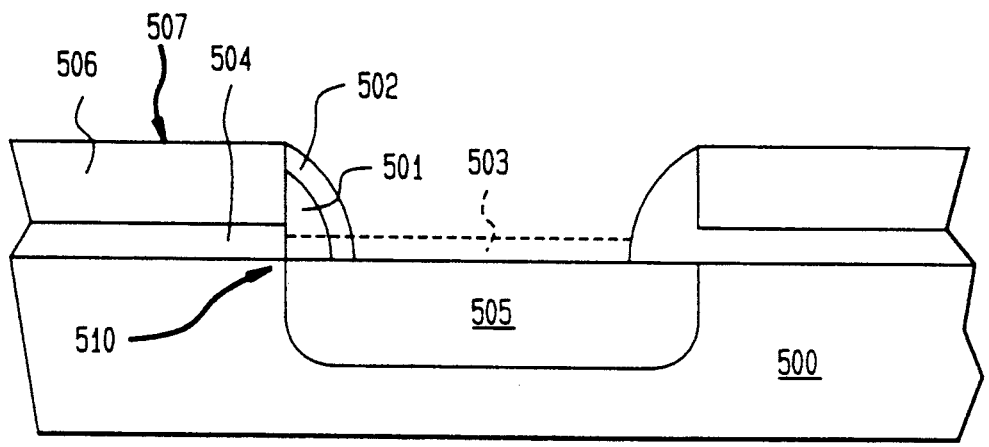
FIG. 5 illustrates a spacer formation step for improving silicide formation in accordance with the invention.

Once the sidewall isolation regions 420 shown in FIG. 4a have been provided, as previously described, appropriate P— type body regions 431 and N— type body regions 432 are formed, preferably by implantation and activation as shown in FIG. 4b. The body regions 431, 432 may extend deeper into the substrate than the depth of the isolation regions 420. A layer of silicon dioxide 471 or other dielectric suitable to form a gate dielectric is provided directly on the top surface 401. A layer 450 of gate material, preferably of polycrystalline silicon, is formed over oxide 471 and the polycrystalline silicon layer 450 is patterned preferably by photolithographic techniques to define gate polycrystalline silicon regions 451 and device region extensions 452. Once this polycrystalline silicon layer 450 is patterned, it may be desirable to implant lightly doped drain/source regions, including N type regions 441 in the P— type body 431, and P type regions 442 in the N— type body 432. These regions are proximate the sides of sidewall isolation regions which separate the respective NMOS and PMOS devices. Dielectric spacers 451′ and 452′ are then formed preferably of silicon dioxide at the edges of the polycrystalline silicon regions 451, 452. A "spacer" as used herein generally refers to a structure formed by conformal deposition followed by anisotropic vertical removal although other fabrication methods may be employed. These spacers 451′ and 452′ may be formed by conformal deposition of a dielectric, for instance silicon dioxide, silicon nitride, oxynitride or any other dielectric which may be conformally deposited, over the wafer on both horizontal and vertical surfaces, then removing the dielectric layer in an anisotropic vertical etch in a reactive ion etcher until the dielectric is removed from the horizontal surfaces but remains on the vertical surfaces where the oxide had a greater vertical thickness. This will result in oxide spacers formed adjacent the vertical surfaces and on the horizontal surfaces near the vertical surfaces. The horizontal surface in this structure may be the substrate or any other foundation layer upon which a vertical contact is to be formed. It will be common for the horizontal width of the spacer near the horizontal surface at the bottom of the vertical surface to extend from the vertical surface by approximately the thickness of the conformal oxide. This may be up to about 20,000 Angstroms but is preferably less than about 5,000 Angstroms. The spacer then laterally contacts the vertical edge to the extent that such edges of portions of layer 450 were exposed, such as at the edges of regions 451 and 452 shown in FIG. 4b. A mask layer preferably of photoresist, is applied over the structure and is patterned to protect the gate polycrystalline silicon 451 and gate spacer oxides 451′ which are adjacent the source side and the drain side of the gate. The exposed source and drain spacers 452′ and the exposed portions of oxide 471 are removed as shown in FIG. 4c. The photoresist is removed and any exposed regions of 471 can now be removed. The area over P+ regions is covered by a mask, preferably of photoresist, and an N+ impurity is implanted. Then the N+ areas are masked and a P+ impurity is implanted. For convenience, FIG. 4d is provided to illustrate the doping of the regions shown in FIG. 4c following the implant steps which provide new regions 441′ and 442′ shown outlined by dashed lines. A silicide 480, which FIG. 4d also shows, is formed over the exposed single crystalline and polycrystalline silicon by a blanket metal deposition followed by heating of the wafer to form a silicide where the metal contacts either the polycrystalline or single crystalline silicon. The metal in areas over the oxide (dielectric) will not be converted to a silicide. It is then possible to chemically remove the metal but not the silicide by etching in an environment where the metal but not the silicide is etched. In an example where the metal is platinum, the etch can be accomplished by exposing the surface to an acid such as aqua regia which removes the metal but does not etch the oxide or the silicide. As illustrated, no silicide forms on the gate spacer 451′ but, due to silicide formation on the exposed source/drain regions 441 and 442 and the exposed edges of polycrystalline silicon regions 450 and 452, the edge of the thin oxide beneath layer 450, is bridged by the silicide. The oxide layer beneath layer 450 is approximately 250 angstroms deep which is a small enough distance for bridging to occur but spacers 451′ are approximately 5000 angstroms a distance long enough to prevent bridging from occurring. It is important to insure that the silicide does not ohmically contact the body region. Thus, in situations where the source to body junction does not substantially diffuse beyond the edge of the polycrystalline silicon region, it may be desirable to form a small spacer 501 of oxide or polycrystalline silicon as shown in FIG. 5 prior to silicide formation. This will increase the minimum distance from corner 510 of the body 500 to the silicide. It would also be possible to form a layer 503 of epitaxial silicon on the silicon by the selective deposition of silicon onto the silicon regions but not on the spacer oxide regions instead of providing the spacers 501. This layer 503 would provide the silicon necessary for silicide formation and thus avoid the consuming of the substrate near the corner 510. This then reduces the chances of shorting from the silicide to the body.

It will be possible to use the above-described procedure to provide a vertical contact from any region of a conductive or semiconductive material to an overlying region of the same or a different conductive or semiconductive material which are separated by a dielectric. Thus, for instance, a first polycrystalline silicon conductor may be covered by a thin dielectric, an aperture may be opened in the dielectric to expose the conductor, a second polycrystalline silicon conductor may be provided adjacent an edge of the aperture and by performing a silicide formation step, contact will be made from the first to the second conductor. However, if a dielectric were applied which forms dielectric spacers as described above, no electrical contact will be made from the first to the second layer.

An alternative silicide formation process may be utilized in which a silicide or silicide forming metal is selectively provided at only those locations where a silicide is to be formed. This permits silicide formation without the need to subsequently remove the unreacted metal. A silicide may be selectively provided by selectively exposing silicon regions where a silicide is to be formed and depositing a silicide forming metal only where such silicon is exposed. A description of a selective silicide formation process is contained in U.S. Pat. No. 4,343,082, issued Aug. 10, 1982 entitled "Method of Making Contact Electrodes to Silicon Gate and Source and Drain Regions of a Semiconductor Device" by M. P. Lepselter and S. M. Sze. A method for selective deposition of metal on silicon is disclosed in U.S. Pat. No. 4,595,608, issued June 17, 1986 entitled "Method for Selective Deposition of Tungsten on Silicon" by E. M. King, K. E. Gsteiger and J. S. Raby.

Use of this process alternative could be adapted to provide a silicide over portions of a sidewall isolating region. The silicide may provide a vertical contact to device regions formed adjacent to the respective sides of the sidewall isolating region. By providing the silicide only at the edge portions and leaving an unsilicided width of silicon, such as polycrystalline silicon, over the dielectric, this non-silicided portion will serve for instance as a resistor between the two device regions. The resistance of a resistor formed in this manner can be regulated by the selection of the width and resistivity of the non-silicided portion of the silicon layer.

The completion of the process includes the formation of a dielectric over the silicide, opening apertures in the dielectric through which electrical contact can be made to the silicide, providing conductors which establish contact to the silicide and providing a passivating layer over the circuitry. It is thus possible, through use of this process, to make all contacts to the silicide level on top of the polycrystalline silicon regions thus obviating the need to provide deep metal contacts down to the single crystalline regions at the respective sources and drains. In a CMOS process where the drains of the adjacent NMOS and PMOS devices are to be shorted together, it is now possible to abut the drain region extensions and short these extensions by forming a silicide thereover.

Since the polycrystalline silicon is used as the drain extensions and also as the gate material, it can be deposited in the same operation and at the same time. Thus, it is possible to extend the polycrystalline silicon drain extensions to form the gates of subsequent transistors. This technique greatly reduces the area required to interconnect transistors within a circuit. The connection between the drain and drain extension can be made by a vertical self-aligned contact. This vertical contact significantly reduces the area required to make a single crystal to polycrystalline silicon contact.

An improved vertical contact can be provided by forming a conductor against a lateral edge of the drain (and/or source) extension, bridging any dielectric, such as silicon dioxide or silicon nitride which may be separating the drain from the drain extension and contacting the top surface of the drain. This vertical contact may be of metal, a silicide or any conductive or semiconductive material. The top of the vertical contact may be lower than or even with the top of the drain extension to provide improved planarity to the structure at the contact region. FIG. 5 illustrates a conductor 502 bridging a dielectric 504 wherein the conductor does not extend vertically above the upper surface 507 of the region 506 which may serve as a source or drain extension for region 505 which for purposes of this example may be an MOS source or drain. This vertical contact structure may be employed for other contacts than for a device region to a device region extension. If, for instance, region 505 were any conductive or semiconductive material (including materials selected from typical conductor materials such as aluminum or a silicide) separated from region 506 of the same or a different material having conductive or semiconductive properties, a vertical contact 502 could be provided which does not contact the top surface of layer 506. Such a vertical contact could be formed by depositing, by conformal deposition, a metal conductor onto all surfaces not previously covered by an appropriate mask. This mask is not provided at those locations where a vertical contact is to be formed. An example of this would be a metal lift off process. Alternatively, a conformal metal deposition followed by a vertical etch will form metal vertical contacts similar in structure to the oxide spacers described with respect to the gate spacers 451' of FIG. 4b. Alternatively, a silicide vertical contact could be formed as previously described. This silicide would then be in contact with the top surface of the layer which forms the base layer on which the dielectric is formed, would be in contact with a vertical dielectric edge, and would be in contact with a vertical edge of the overlying layer of conducting or semiconducting material. In yet another embodiment, it is possible to form the vertical contact of polycrystalline silicon which is sufficiently doped to provide the necessary conductivity. This could be accomplished by providing a conformal layer of polycrystalline silicon, masking and patterning the polycrystalline silicon to leave polycrystalline silicon at the vertical contact locations. These polycrystalline locations may be appropriately doped either before or after the masking and patterning steps. In the event that the underlying layer is single crystalline silicon, it is possible to form by epitaxial growth the necessary silicon regions for vertical contact formation. These vertical contact locations will have a polycrystalline makeup adjacent the vertical dielectric edge which may be bridged by single crystal material forming on the base layer. Alternatively, the epitaxially formed silicon may be at least partially converted to a silicide or covered by a silicide to complete the vertical contact formation. By forming the vertical contact as a thin layer of less than about 20,000 Angstroms, it is possible to achieve high packing density relative to alternative contact arrangements. As described herein, it is possible to provide vertical contacts in accordance with the invention which have substantially lower area requirements than previously known contact arrangements.

With respect to the formation of vertical contacts, the present invention contemplates that the contacts will be self aligned with the vertical edges on which electrical contact is made. This is due to the various process options which include the provision of conformal layers of for instance, polycrystalline silicon, or a silicide forming metal. Viewed differently, it can be seen that the blanket conformal deposition of a conductive or semiconductive contact (or contact forming material) followed by a reactive ion etch which removes the deposited material from the horizontal surfaces of the structure will result in a self aligned contact formation on the vertical surfaces. In the foregoing description, the term "substrate" has been used in addition to its ordinary meanings to designate a foundation layer for the fabrication of multilayer structures. Thus, a "substrate" may be, for instance, a layer of recrystallized polycrystalline silicon over a dielectric, such as in a silicon-on-insulator structure, or composite dielectrically isolated structure having a polycrystalline silicon support member and a plurality of single crystal silicon islands. The term "foundation layer" is used herein to designate any layer on which some other layer or structure is provided. Thus, a substrate is a foundation layer if other structure is provided on the layer. However, a foundation layer may not rise to the level of a substrate such as for instance where a level of interconnect is the foundation layer. In this description, the term "substantially coplanar" is used in addition to its ordinary meaning to designate that the top surface of an isolating region is within 1500 Angstroms above the top surface of the substrate.

From the preceding description of the preferred manners of implementing and practicing the invention it is evident that the objects of the invention are obtained, and although the invention has been described and illustrated in detail, it is to be clearly understood that the same is by way of illustration and example only and is not meant to be taken by way of limitation. It is intended that the following claims shall be interpreted in accordance with the full scope of the underlying invention including any and all variations thereof which might be suggested or obvious to those skilled in the pertinent arts.

What is claimed is:

1. A complementary field effect transistor device comprising:
    a silicon substrate having a sidewall isolating region defining a first and second isolated region on a first and second side of said sidewall isolating region respectively, wherein said first isolated region is of a first conductivity type, and said second isolated region is of a second conductivity type,
    a dielectric layer covering portions of said first and second isolated regions,
    a first semiconductor layer formed on said dielectric layer and, a second semiconductor layer formed on said first semiconductor layer and on said substrate, and wherein said second semiconductor layer has a first resistance to the passage of impurities therethrough, and said combined first and second semiconductor layers have a substantially greater resistance to the passage of impurities therethrough,
    and wherein said first isolated region includes a source and a drain region of said second conductivity type and said second isolated region includes a source and a drain region of said first conductivity type, and
    wherein a portion of said second semiconductor layer extends contiguously over said sidewall isolating region, and
    further comprising drain extension regions which extend into said portion of said second semiconductor layer that extends contiguously over said sidewall isolating region.

2. The device of claim 1, wherein said respective drain extension regions form a PN junction over said sidewall isolating region.

3. The device of claim 2, further comprising a conductive contact to contact both said respective drain extension regions.

4. A complementary field effect transistor device comprising:
    a semiconductor substrate having a planar surface and containing a dielectric region having a top surface co-planar with the planar surface of said semiconductor substrate and extending from said planar surface into said substrate, so as to define first and second spaced apart semiconductor regions having sidewalls bounded by said dielectric region, said first semiconductor region having a first conductivity type and said second semiconductor region having a second conductivity type, opposite to said first conductivity type;
    a first gate insulator layer formed on a first surface portion of said first semiconductor region;
    a second gate insulator layer formed on a first surface portion of said second semiconductor region;
    a first semiconductor layer formed on said first gate insulator layer;
    a second semiconductor layer formed on said second gate insulator layer;
    first source and drain regions of said second conductivity type formed in said first semiconductor region such that said first drain region abuts said dielectric region;
    second source and drain regions of said first conductivity type formed in said second semiconductor region such that said second drain region abuts said dielectric region;
    a third semiconductor layer formed n the top surface of said dielectric region and extending thereacross so as to contact said first and second drain regions, said third semiconductor layer containing a third semiconductor region of said first conductivity type and a fourth semiconductor region of said second conductivity type, said third semiconductor region contacting said second drain region and said fourth semiconductor region contacting said first drain region; and
    conductor material formed on said third semiconductor layer electrically shorting the third and fourth semiconductor regions thereof.

5. A complementary field effect transistor device according to claim 4, wherein each of said first and second semiconductor layers has a first thickness sufficient to prevent the passage of impurities therethrough at a prescribed impurity introduction energy, and wherein said third semiconductor layer has a second thickness, less than said first thickness, insufficient to prevent the passage of impurities therethrough at said prescribed impurity introduction energy, said prescribed impurity introduction energy corresponding to that by way of which said first and second source and drain regions are formed in said first and second semiconductor regions, respectively.

* * * * *